United States Patent

Shou et al.

[11] Patent Number: 6,031,415
[45] Date of Patent: *Feb. 29, 2000

[54] MATCHED FILTER CIRCUIT FOR SPREAD SPECTRUM COMMUNICATION

[75] Inventors: Guoliang Shou; Changming Zhou; Makoto Yamamoto, all of Tokyo; Mamoru Sawahashi; Fumiyuki Adachi, both of Kanagawa; Sunao Takatori, Tokyo, all of Japan

[73] Assignees: NTT Mobile Communications Network, Inc.; Yozan Inc., both of Tokyo, Japan

[*] Notice: This patent is subject to a terminal disclaimer.

[21] Appl. No.: 08/733,820

[22] Filed: Oct. 18, 1996

[30] Foreign Application Priority Data

Oct. 20, 1995 [JP] Japan .................................. 7-297602

[51] Int. Cl.[7] .............................. H03K 5/00; H03D 1/00
[52] U.S. Cl. ........................... 327/552; 327/554; 327/94; 327/403; 327/361; 327/337; 375/343; 708/313
[58] Field of Search ..................... 327/552, 554, 327/556, 557, 558, 559, 403, 361, 311, 94, 337; 383/172; 330/294, 107, 306, 9; 708/313; 375/343

[56] References Cited

U.S. PATENT DOCUMENTS

| | | | |
|---|---|---|---|
| 5,388,063 | 2/1995 | Takatori | 708/319 |
| 5,396,446 | 3/1995 | Shou | 708/819 |
| 5,424,973 | 6/1995 | Shou | 708/801 |
| 5,500,810 | 3/1996 | Shou | 708/319 |
| 5,502,664 | 3/1996 | Shou | 708/319 |
| 5,563,812 | 10/1996 | Shou | 708/7 |
| 5,686,861 | 11/1997 | Shou et al. | 327/558 |
| 5,737,368 | 4/1998 | Shou | 375/343 |
| 5,740,096 | 4/1998 | Shou | 708/819 |
| 5,751,184 | 5/1998 | Shou | 322/552 |
| 5,781,584 | 7/1998 | Zhou | 375/207 |
| 5,790,590 | 8/1998 | Shou | 375/200 |
| 5,841,315 | 11/1998 | Shou | 327/552 |
| 5,844,937 | 12/1998 | Zhou | 375/207 |

OTHER PUBLICATIONS

Takana et al., "Development of Low Power Consumption LSI for SS Communication," Technical Report of IEICE, SST95–77 (1995–10), pp. 31–36, The Institute of Electronica, Information and Communication Engineers, 1995.

Ogawa et al., "Development of 1 Chip SS Communication LSI Using Digital Matched Filgers," Technical Report of IEICE, ISEC92–42 SST94–65 (1994–12), pp. 33–38, The Institute of Electronica, Information and Communication Engineers, 1994.

"Dual 64–TAP, 11 Mcps, Digital Matched Filter/Correlator, STEL–3310," Stanford Telecommunications, ASIC & Custom Products Group, pp. 126 and 130.

*Primary Examiner*—Dinh T. Le
*Attorney, Agent, or Firm*—Pillsbury Madison & Sutro LLP

[57] ABSTRACT

The present invention provides a matched filter circuit available for processing long P/N codes in a small size circuit. A matched filter circuit according to the present invention performs the following processes in the proposed invention: i) sampling and holding circuits multiply part of the number of a long code; ii) multipliers are input in parallel to the sampling and holding circuit from the first multiplier register which can hold as many PN codes as the number of the sampling and holding circuits in i); iii) the PN codes are stored in the second multiplier register of the same capacity of the first multiplier resister when there is a PN code to be used sequentially to be PN codes; and iv) the PN codes in the second multiplier register are transmitted in parallel to the first multiplier register. The PN code is input to the second multiplier register in serial.

14 Claims, 4 Drawing Sheets

US 6,031,415

MATCHED FILTER CIRCUIT FOR SPREAD SPECTRUM COMMUNICATION

FIELD OF THE INVENTION

The present invention relates to a matched filter circuit for a spread spectrum communication system which can be used, for example, in mobile communications or a wireless LAN, especially to a matched filter which is capable of high speed processing by a LSI of small size with reduced power consumption.

BACKGROUND OF THE INVENTION

A matched filter is a filter for judging the identification of two signals. In spread spectrum communications, a unique spreading code sequence is allocated for each user. Each user finds a signal transmitted for the user by a matched filter to which one spreading code sequence is applied. The matched filter outputs a correlation peak when the signal is the user's for aquisition and holding.

Assuming a spreading code to be PN(i), a tip time to be Tc, a spreading ratio to be M, a time to be (t), an input signal at a time t to be S(t) and a correlational output signal at a time t to be R(t), the following formula (1) can be obtained.

$$R(t) = \sum_{i=0}^{M-1} PN(i) \cdot S(t - i \cdot Tc) \quad (1)$$

Here, PN(i) is a 1 bit data sequence.

As double or higher order sampling is necessary for the acquisition, the calculation of the formula (1) is performed in a plurality of systems at the same time using a plurality of matched filters and the calculation results are added. In order to realize such a matched filter, a digital circuit or a SAW (Surface Acoustic Wave) device was conventionally used. However, using a digital circuit, the electric power consumption was necessarily large because the size of a circuit was large, therefore, it was not appropriate for mobile communications. Using a SAW element, it was not easy to realize a whole circuit by a single element and the S/N ratio was low.

Since the spreading code is a 1 bit string, the inventors have proposed a matched filter in the Japanese patent application No. 7-212438, which is high-speed and can be implemented as a small size, low power LSI. The sequence of processing is as follows: i) sampling and holding input signals as analog signals of a time series, ii) branching them out into the signal groups "1" and "−1" by a multiplexer, and iii) adding the signals in each group in parallel by a capacitive coupling. However such a matched filter circuit still has large circuit size when a long P/N code was processed making it difficult to introduce into mobile communications.

SUMMARY OF THE INVENTION

The present invention solves the above problem and has an object to provide a matched filter circuit available for processing P/N long codes in a small size circuit.

A matched filter circuit according to the present invention performs the following processes: i) sampling and holding circuits are used for multiplying by part of the number of a long code; ii) multipliers are input in parallel the sampling and holding circuit from the first multiplier register which can hold as many PN codes as the number of the sampling and holding circuits in i); iii) the PN codes are stored in the second multiplier register having the same capacity as the first multiplier resister when there is a PN code to be used sequentially; and iv) the PN codes in the second multiplier register are transmitted in parallel to the first multiplier register. The PN code is input to the second multiplier register in serial.

PREFERRED EMBODIMENT OF THE PRESENT INVENTION

Hereinafter an embodiment of the matched filter circuit according to the present invention is described with reference to the attached drawings.

Figure 1:
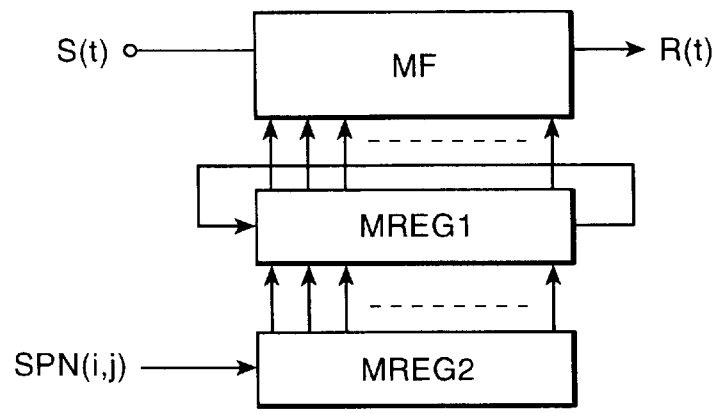
FIG. 1 shows a block diagram of an embodiment of the matched filter circuit according to the present invention.

In FIG. 1, the first multiplier register MREG1 is connected to a matched filter MF. The matched filter multiplies a PN code stored in the first multiplier register and an input signal S(t), and outputs the total summation of the multiplication results as an output signal R(t). MREG1 is a shift-register for sequentially shifting stored data from the start point to the end (in the figure, from the left end to the right end). The data on the end point is fed back to the start point. Consequently, it is possible to circulate the PN code. Multiplication is performed on a pair of input signals while the PN code is circularly changed in sequence.

To MREG1, the second multiplier register MREG2 is connected which has a data area corresponding to the data area of MREG1. Data of MREG2 can be transferred in parallel to MREG1. A serial input is provided at a start point of MREG2, and PN code is serially input to it. For example, when a plurality PN codes of number of m can be stored and a long code n times as long as it is used, the PN codes from the first to the m-th are serially input to MREG2 and the PN codes are transferred in parallel to MREG1 after completing the serial inputs. The second m PN codes are input to MREG1 before completing the first cycle. Then new PN codes are transferred from the MREG2 to the MREG1 just after the multiplication. In FIG. 1, j-th PN code of i-th input of PN codes to be input to MREG2 is designated as SPN(i,j).

Figure 10:
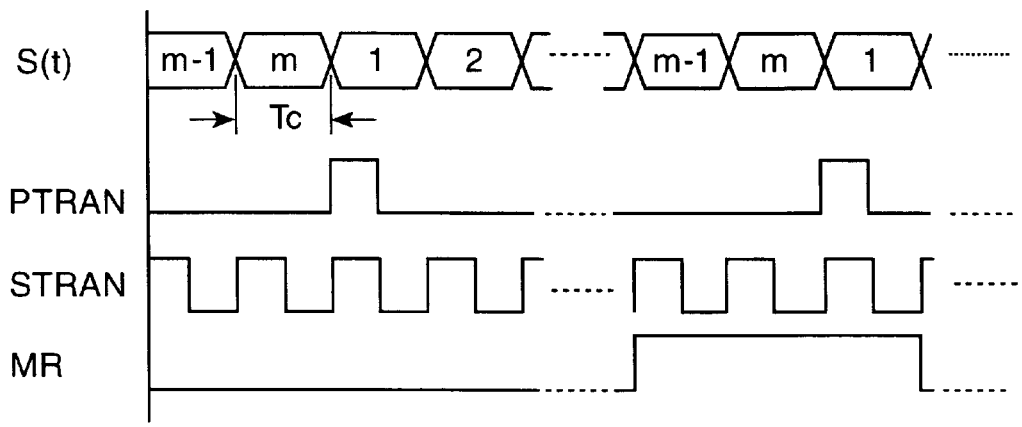
FIG. 10 illustrates the relationship of the timings of a multiplier register in FIG. 1 and input timings.

Timing of writing and transferring of data to MREG1 and MREG2 is shown in FIG. 10. A parallel transfer signal PTRAN and a serial transfer signal STRAN are generated synchronously with the input signal S(t). PTRAN provides a timing for transferring a PN code from the MREG2 to the MREG1, and STRAN provides a timing for serially inputting a PN code to the MREG2. PTRAN is usually masked to be invalid, and becomes valid by a mask removing signal MR only when the transfer is necessary. Therefore, PTRAN is generated during a predetermined period from the trailing edge of the m-th last signal. The m-th signal is shown by "m" in FIG. 10. The signal PTRAN can be easily generated according to a sampling clock and so on. The mask removing signal is generated during a period sufficiently long to include the timing of PTRAN and to insure that PTRAN is valid.

STRAN is the same signal as the sampling clock, and is always generated as a valid signal. The SPN(i,j) is input to MREG2 synchronously with the order of the data of S(t), and a SPN(i,m) is input synchronously with the sampling of m-th data. When it is necessary to keep the data in MREG2 constant, the same data is repeatedly input. In this case, input timing of S(t) is synchronized with the data cycle of S(t).

As mentioned above, the circuit size of MF is independent the length of PN code when MF has a circuit for partially applying the PN code. Thus the required size of the circuit is minimized.

Figure 2:
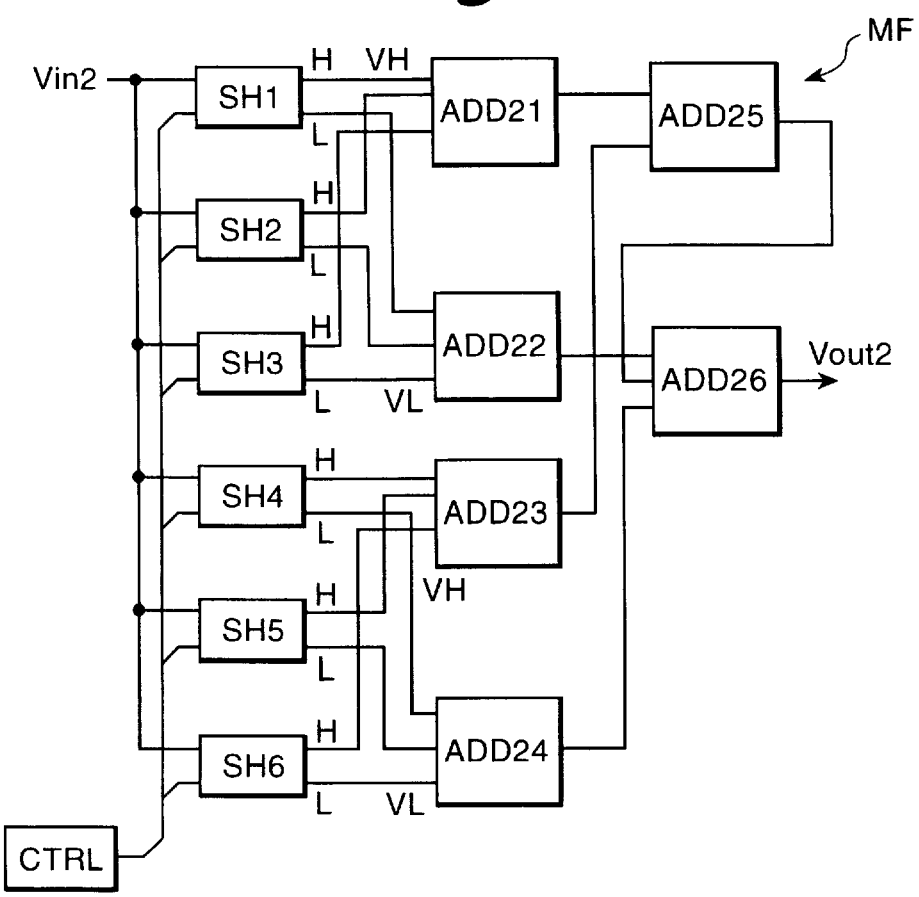
FIG. 2 shows a block diagram of a calculation portion of each matched filter circuit in the embodiment.

In FIG. 2, in the calculating portion MF of the matched filter circuit, an input voltage Vin2 is parallelly connected to a plurality of sampling and holding circuits SH1, SH2, SH3, SH4, SH5 and SH6, and two types of outputs of H (high) and L (low) are generated from each sampling and holding circuit. A control circuit CTRL is connected to each sampling and holding circuit so as to control Vin2 to be input to one of the sampling and holding circuits, successively.

The sampling and holding circuit introduces the input voltage Vin2 to either H side or L side according to the control of the control circuit. A reference voltage Vr is connected by the control circuit to the other side. This route selection is performed according to each bit of spreading code (PN code) and a multiplication of input voltage by the code is accomplished only by this selection.

Figure 3:
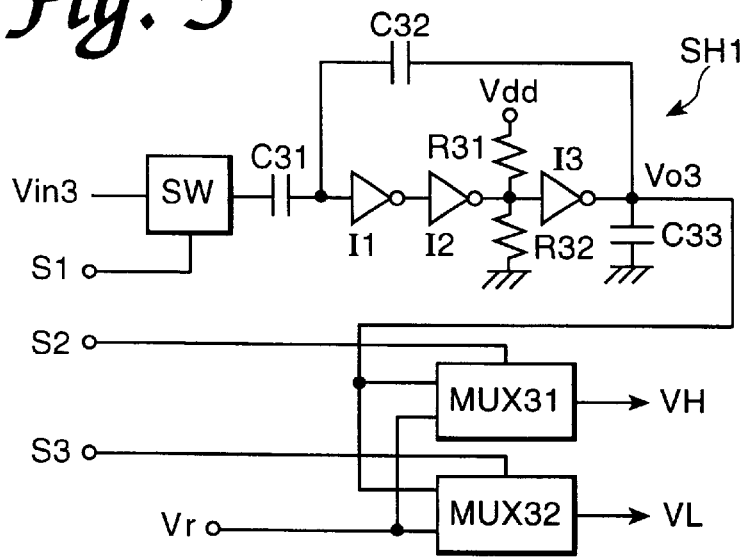
FIG. 3 shows a sampling and holding circuit in FIG. 2.

The sampling and holding circuit SH1 is structured as in FIG. 3, in which an input voltage Vin3 is connected to a switch SW. An output of switch SW is connected to capacitance C31, and three stages of serial MOS inverters 11, 12 and 13 are connected to an output of capacitance C31. An output of MOS inverter 13 of the last stage is connected to an input of 11 through feedback capacitance C32. Consequently, an inversion of Vin3 is generated at the output of 13 with a good linearity. An output of 13 is input to two multiplexers MUX31 and MUX32. A common reference voltage Vr is connected to the multiplexers. When SW is closed, C1 is charged by an electric charge corresponding to Vin3, and the linearity of an output is guaranteed by a feed-back function of 11 to 13. When a switch SW is open after it, sampling and holding circuit SH1 holds Vin3.

Switch SW, multiplexers MUX31 and MUX32 are controlled by control signals S1, S2 and S3. After S1 is once closed, SW is opened at the timing of sampling of the input voltage. S2 and S3 are inverted signals. When one of the multiplexers outputs Vin3, the other outputs Vr.

MUX31 generates an output of H (high type) and MUX32 generates an output of L (low type). H and L correspond to each bit of the spreading codes "1" and "−1". When the code "1" is to be multiplied to an input voltage, Vin3 is output from MUX31, and when the code "−1" is to be multiplied, Vin3 is output from MUX32.

The output from 13 of the last stage is connected to the ground through a grounded capacitance C33. The output of 12 of the second stage is connected to the supply voltage Vdd and the ground through a pair of balancing resistances R31 and R32. Unstable oscillations of an inverted amplifying circuit including feedback circuit is prevented by such a structure.

Figure 4:
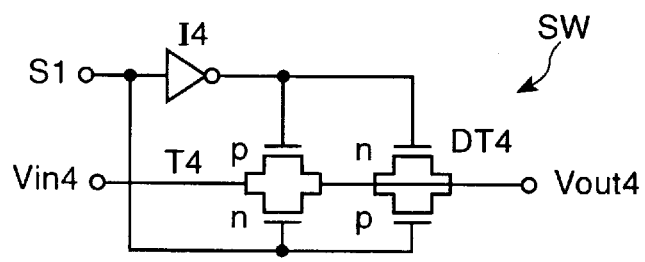
FIG. 4 shows a switch in FIG. 3.

As shown in FIG. 4, the switch SW includes a transistor circuit T4 in which a source and a drain of a n-type MOS transistor are connected to a drain and a source of a p-type MOS transistor, respectively. Vin4 is connected to a terminal of a drain of the nMOS of the transistor circuit and a terminal of a source of nMOS is connected to an output terminal Vout4 through a dummy transistor DT4 similar to the nMOS. S1 is input to the gate of the nMOS transistor of the transistor circuit T4, and an inverted signal of S1 by an inverter 14 is input to the gate of pMOS transistor. When S1 is high level, T4 is conductive and when it is low level, T4 is cut off.

Figure 5:
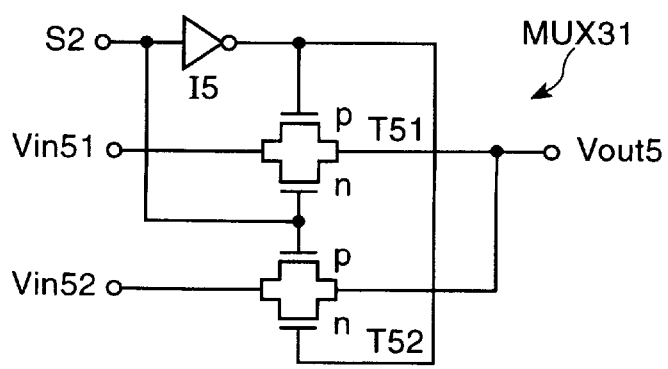
FIG. 5 shows a multiplexer in FIG. 3.

In FIG. 5, there are provided transistor circuits T51 and T52 each consisting of nMOS and pMOS, a source of nMOS and drain of pMOS are connected to each other and to a common output terminal Vout5.

As shown in FIG. 5, in multiplexer MUX31, the terminal of the source of nMOS of transistor circuits T51 and T52 is connected to the common output terminal Vout5. An output Vo3 ("Vin51" in FIG. 5) of the MOS inverter 13 is connected to a terminal of a drain of the nMOS of T51, and the reference voltage Vr ("Vin52" in FIG. 5) is connected to a drain of T52. The signal S2 is input to a gate of the nMOS transistor of transistor circuit T51 and gate of the pMOS transistor of transistor circuit T52. The signal S2 inverted by inverter I5 is input to gates of the pMOS of T51 and nMOS of T52. When S2 is high level, T51 is conductive and T52 is cut off, and when low level, T52 is conductive and T51 is cut off. That is, MUX31 can alternatively output Vo3 or Vr in response to the control signal S2. Though it is not shown in the figure, multiplexer MUX32 is structured similar to MUX31 and Vo3 and Vr are connected inversely. Vr and Vo3 of FIG. 5 are connected to T51 and T52, respectively, contrary to the construction of FIG. 5. Consequently, MUX32 output inversely to MUX31; that is, when MUX31 outputs Vo3, MUX32 outputs Vr and when MUX31 output Vr, MUX32 outputs Vo3.

Signal S2 corresponds to spreading code and outputs 1×Vin2=Vin2 to AD21 when S2=1. At this time, S3 is −1 and Vr corresponding 0 is output to ADD22. When S2=−1, Vr corresponding to 0 is output to ADD21. Here, S3=+1 and outputs 1×Vin2=Vin2 to ADD22.

The S(t−i·Tc) in the formula (1) is an input voltage held in each sampling and holding circuit, and PN(i) is the signal S2(spreading code) to be input to each sampling and holding circuit. The order of the spreading codes is predetermined corresponding to the order of input signals. When a new signal is taken, the oldest signal is substituted by the newest signal. It causes change in relationship between each sampling and holding circuit SH1 to SH6 and PN(i), so PN(i) is shifted by the control circuit. When a code shift is not performed, code transfer through successive sampling and holding circuits and some errors may be generated due to data transfer. It will be understood that the code shift is effective to prevent the error during data transfer.

The accumulation in formula (1) is performed in the addition portions from ADD21 to ADD26, VH and VL of output voltages of each sampling and holding circuit are accumulated in ADD25 and ADD26, respectively. This accumulation is not performed directly. Sampling and holding circuits are divided into a plurality of groups, outputs VH and VL are once accumulated in ADD21 to ADD24 by each group. All of the outputs of ADD21 and ADD23 for accumulating VH are input to ADD25, and all of the outputs of ADD22 and ADD24 for accumulating VL are input to ADD26. Further, an output of ADD25 is also input to ADD26. In FIG. 2, six sampling and holding circuits are shown and divided into two groups with three circuits.

Generally a spreading code includes from 100 to several hundreds or more bits. Sampling and holding circuits are set to be an appropriate number, for example 128, for a long code.

Figure 6:
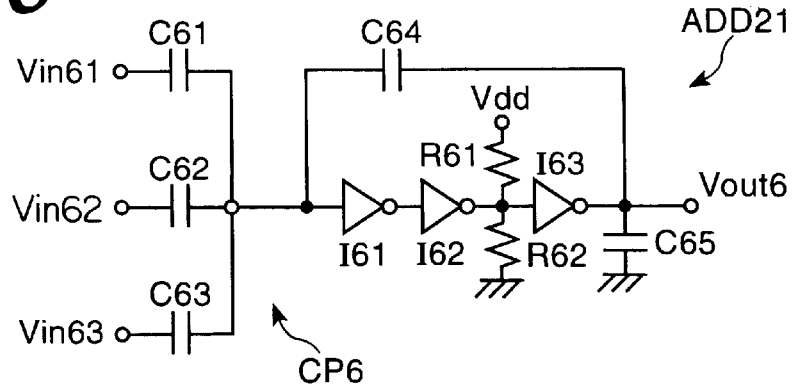
FIG. 6 shows the first adder in FIG. 2.

As shown in FIG. 6, the addition portion ADD1 includes a capacitive coupling CP6 constructed by capacitances C61, C62 and C63 of the number equal to the number of sampling and holding circuits in one group. An output of CP6 is connected to three serial stages of MOS inverters 161, 162 and 163. An output of MOS inverter 13 of the last stage is connected to an input of 161 through a feedback capacitance C64. An output of CP6 is generated at an output of 163 with a good linearity. Assuming input voltages of capacitances C61, C62 and C635 to be Vin61, Vin62 and Vin63, an output Vout6 of 163 can be expressed by the formula (2).

$$Vout6 = -\frac{C61Vin61 + C62Vin62 + C63Vin63}{C64} \quad (2)$$

Here, Vin61 to Vin63 and Vout6 are voltages referencing the reference voltage Vr. Also it is defined that the capacity ratio of capacitances of C61, C62, C63 and C64 is 1:1:1:3. A normalized output of inverted addition value can be obtained as in formula (3).

$$Vout6 = -\frac{Vin61 + Vin62 + Vin63}{3} \quad (3)$$

By the normalization, the maximum voltage is limited under the supply voltage.

An output of the last stage 163 is connected to the ground through a grounded capacitance C65. An output of the second stage inverter 162 is connected to the supply voltage Vdd and the ground through a pair of balancing resistances R61 and R62. Unstable oscillation of inverted amplifying circuit including feedback line is prevented by the structure.

Figure 7:
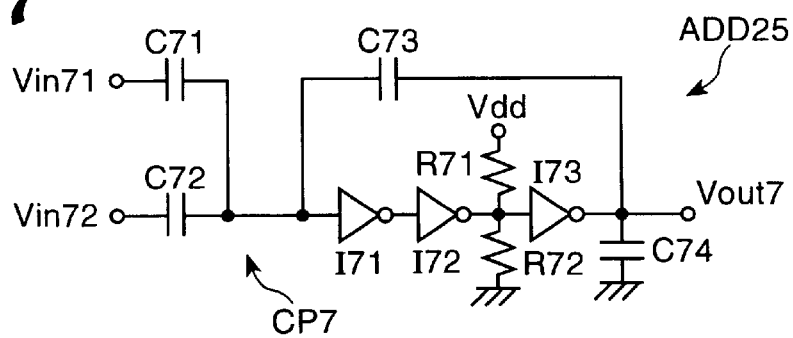
FIG. 7 shows the fifth adder in FIG. 2.

As shown in FIG. 7, the addition portion ADD25 includes a capacitive coupling CP7 which includes capacitances C71 and C72 of corresponding number to the number of the addition portions ADD21 and ADD23. The output of CP7 is connected to three stages serial MOS inverters 171, 172 and 173. An output of MOS inverter 173 of the last stage is connected to an input of 171 through a feedback capacitance C73. An output of CP7 is generated at an output of 173 with a good linearity. Assuming input voltages of capacitances C71 and C72 to be Vin71 and Vin72, an output Vout7 of 173 can be expressed by the formula (4).

$$Vout7 = -\frac{C71Vin71 + C72Vin72}{C73} \quad (4)$$

Here, Vin71 and Vin72 are voltages referencing the reference voltage Vr. the capacitance ratio is C71:C72:C73= 1:1:2. Then, a normalized output of an inverted addition is obtained as in formula (5).

$$Vout7 = -\frac{Vin71 + Vin72}{2} \quad (5)$$

By the normalization, the maximum voltage is limited under the supply voltage.

An output of the last stage inverter 173 is connected to the ground through grounded capacitance C74. An output of the second stage inverter 172 is connected to the supply voltage Vdd and the ground through a pair of balancing resistances R71 and R72. The unstable oscillation of inverted amplifying circuit including feedback line is prevented.

Figure 8:
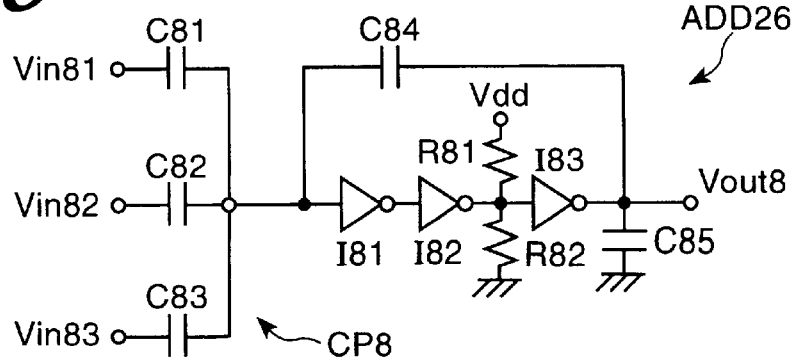
FIG. 8 shows the sixth adder in FIG. 2.

As shown in FIG. 8, addition portion ADD26 includes capacitive coupling CP8 which includes capacitances C81, C82 and C83 of the number corresponding to the number of addition portion ADD22, ADD24 and ADD25 connected thereto, and an output of CP8 is connected to three stages serial MOS inverters 181, 182 and 183. An output of MOS inverter 183 of the last stage is connected to an input of 181 through a feedback capacitance C84. An output of CP8 is generated at an output of 183 with a good linearity. Assuming input voltages of capacitances C81, C82 and C83 (the voltage referencing Vr) to be Vin81, Vin82 and Vin83, an output Vout8 of 183 (the voltage referencing Vr) can be expressed by the formula (6)

$$Vout8 = -\frac{C81Vin81 + C82Vin82 + C83Vin83}{C84} \quad (6)$$

It is defined that the capacity ratio is C81:C82:C83:C84= 1:1:2:2. A normalized output of inverted addition value can be obtained as in formula (7).

$$Vout8 = -\frac{Vin81 + Vin82 + 2Vin83}{2} \quad (7)$$

Here, the weight of C83 is defined twice as large as C81 and C82 so as to cancel the influence of the normalization by ADD25 and to agree to unnormalized V81 and V82. By the normalization, the maximum voltage is limited under the supply voltage.

An output of the last stage inverter 183 is connected to the ground through a grounded capacitance C85. An output of the second stage inverter 182 is connected to the supply voltage Vdd and the ground through a pair of balancing resistances R81 and R82. The unstable oscillation of inverted amplifying circuit including feedback is prevented. Those skilled in the art will recognize that the three inverters within ADD25 invert the data, creating data of the opposite sign. ADD26 adds the inverse of the outputs of ADD22 and ADD24 to the outputs of ADD21 and ADD23. ADD25 and ADD26 thus perform a subtracting operation.

Figure 9:
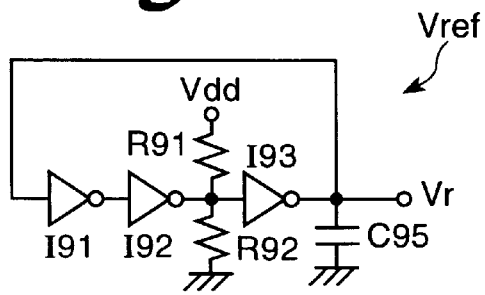
FIG. 9 shows a circuit for generating the reference voltage.

The reference voltage Vr is generated by a reference voltage generating circuit Vref in FIG. 9. The reference voltage generating circuit includes three stages serial inverters 191, 192 and 193, and an output of the last stage is fed back to the first stage input. Similarly to the inverted amplifying portions, unstable oscillation is prevented by a grounded capacitance C95 and balancing resistances R91 and R92. The output of the reference voltage circuit converges to a stable point on which an input and output voltages are equal to each other, and any reference voltage can be generated by changing the threshold of each inverter. Generally, in many cases, it is settled that Vr=Vdd/2 in order to keep dynamic range enough large in both directions of plus and minus. Here, Vdd is the supply voltage of MOS inverter.

Concerning to the matched filter circuit above, the size of the circuit is largely reduced comparing digital one because an addition is performed by an analog system of a capacitive coupling, and processing speed is high because of parallel addition. As the inputs and outputs of the sampling and holding circuit and addition portion are all voltage signal, electric power consumption is low.

The accuracy of an output of an addition portion depends on the dispersion in characteristics of MOS inverters and in capacity ratio of capacitances. The dispersion of inverters can be minimized by placing them closely to one another. The accuracy of the capacity ratio of a capacitance can be improved by dispersively connecting a plurality of unit capacitances A matched filter circuit according to the present invention performs the following processes in the proposed invention: i) sampling and holding circuits are used for multiplication by part of the number of a long code; ii) multipliers are input in parallel to the sampling and holding circuit from the first multiplier register which can hold PN codes as many as the number of the sampling and holding circuit in i); iii) the PN codes are stored in the second multiplier register of the same capacity of the first multiplier resister when there is a PN code to be used sequentially to be PN codes; and iv) the PN codes in the second multiplier register are transmitted in parallel to the first multiplier register. The PN code is input to the second multiplier register in serial. Therefore, it is possible to process a long code by a small circuit.

What is claimed is:

1. A matched filter circuit, comprising:
    a plurality of sampling and holding circuits, each circuit comprising:
        a switch connected to an input voltage and producing a switch output voltage;
        a first capacitance connected to the switch output voltage, and producing a first capacitance output;
        a first inverted amplifying portion having an odd number of stages of MOS inverters connected to the first capacitor output and producing a first inverted amplifying portion output;
        a first feedback capacitance connecting the first inverted amplifying portion output to a first inverted amplifying portion input; and
        a first multiplexer and a second multiplexer each selectively outputting one of the first inverted amplifying portion output and a reference voltage generated by a reference voltage generating circuit; and
    a first addition portion comprising:
        a plurality of second capacitances each corresponding to one of said sampling and holding circuits, each of said second capacitances connected to an output of said first multiplexer of one of said sample and holding circuits, and each of which producing a second capacitance output;
        a second inverted amplifying portion having an odd number of stages of MOS inverters, said second inverted amplifying portion being commonly connected to each second capacitance output, and producing a second inverter amplifying portion output;
        a second feedback capacitance connecting the second inverted amplifying portion output to a second inverted amplifying portion input; and
    a second addition portion comprising:
        a plurality of third capacitances each corresponding to one of said sampling and holding the circuits, each connected to an output of said second multiplexer of one of said sample and holding circuits, and each producing a third capacitance output;
        a third inverted amplifying portion having an odd number of stages of MOS inverters, said third inverted amplifying portion being commonly connected to each third capacitance output, and producing a third inverted amplifying portion output;
        a third feedback capacitance connecting the third inverted amplifying portion output to a third inverted amplifying portion input; and a subtraction portion for subtracting an output of said second addition portion from an output of said first addition portions;
    a control circuit for closing said switch in one of said sampling and holding circuits as well as opening said switch in other of said sample and holding circuits and for causing a selected one of said first and second multiplexers of each sampling and holding circuit to output the first inverted amplifying portion output and the other of said first and second multiplexers of each sample and holding circuit to output the reference voltage;
    a first multiplier register for holding a plurality of PN codes of a number equal to a number of said sampling and holding circuits, for inputting in parallel said PN codes to said control circuit, and for circularly shifting said held PN codes; and
    a second multiplier register having a data area corresponding to a data area of said first multiplier register, to which PN codes are serially inputted, each said data area of said second multiplier register being connected to said data area of said first multiplier register so that said PN code of each data area in said second multiplier is transferred to said data area of said first multiplier register.

2. A matched filter as claimed in claim 1, wherein said transfer of said PN codes from said second multiplier register to said first multiplier register is performed just after completion of a cycle of said matched filter.

3. A matched filter circuit as claimed in claim 2, further comprising means for masking a transfer signal, wherein said transfer is performed in response to said transfer signal which is always generated just after completion of said cycle, said transfer signal being masked by said means for masking when said transfer is not performed and said transfer signal not being masked when said transfer is performed.

4. A matched filter circuit as claimed in claim 1, further comprising a sampling clock generating a sampling signal, wherein said PN code is serially input to said second multiplier register synchronously with said sampling signal.

5. A matched filter circuit as claimed in claim 1, wherein said plurality of sampling and holding circuits and said first and second addition portions comprise a first group, said matched filter circuit further comprising a second group which comprises:
    another plurality of sampling and holding circuits, each circuit comprising:
        a switch connected to an input voltage and producing a switch output voltage;
        a first capacitance connected to the switch output voltage, and producing a first capacitance output;
        a first inverted amplifying portion having an odd number of stages of MOS inverters connected to the first capacitor output and producing a first inverted amplifying portion output;
        a first feedback capacitance connecting the first inverted amplifying portion output to a first inverted amplifying portion input; and
        a first multiplexer and a second multiplexer each selectively outputting one of the first inverted amplifying portion output and a reference voltage generated by a reference voltage generating circuit; and
    a third addition portion connected to an output of said first multiplexer of one of said another plurality of sampling and holding circuits, and producing a third addition portion output, said third addition portion output being inputted to said subtraction means, said third addition portion further comprising:
a plurality of fourth capacitances, each receiving the output of said first multiplexer of each of said another portion of said plurality of said sampling and holding circuits;
a fourth inverted amplifying portion with an odd number of serial MOS inverters, outputs of said fourth capacitances being commonly connected to said fourth inverted amplifying portion; and
a fourth feedback capacitance connecting an output of said fourth inverted amplifying portion to a fourth inverted amplifying portion input, and
a fourth addition portion connected to said second multiplexer of one of said another plurality of sampling and holding circuits, and producing a fourth addition portion output, said fourth addition portion output being inputted to said subtraction means, said fourth addition portion further comprising:
a plurality of fifth capacitances, each receiving the output of said second multiplexer of each of said another plurality of said sampling and holding circuits;
a fifth inverted amplifying portion with an odd number of serial MOS inverters, outputs of said fifth capacitances being commonly connected to said fifth inverted amplifying portion; and
a fifth feedback capacitance for connecting an output of said fifth inverted amplifying portion to a fifth inverted amplifying portion input.

6. A matched filter circuit as claimed in claim 1, wherein said reference voltage generating circuit comprises a reference voltage inverted amplifying portion comprising an odd number of stages of MOS inverters and a reference voltage feedback capacitance connecting an output of said reference voltage inverted amplifying portion to a reference voltage inverted amplifying portion input.

7. A matched filter circuit as claimed in claim 4, wherein a grounded capacitance is connected between each of said first, second and third inverted amplifying portion outputs and ground, and wherein each of said inverted amplifier portions is connected to a source voltage and ground.

8. a matched filter circuit as claimed in claim 6, wherein a grounded capacitance is connected between said reference voltage inverted amplifying portion output and ground, and wherein said reference voltage inverted amplifying portion is connected to a source voltage and a ground.

9. A matched filter circuit as claimed in claim 6, wherein said reference voltage is approximately ½ of a source voltage of said MOS inverter.

10. A matched filter circuit as claimed in claim 1, wherein said control circuit controls each of said sampling and holding circuits so that a status of said sampling and holding circuits may be circulatedly changed by said first multiplier register.

11. A matched filter circuit as claimed in claim 1, wherein said first multiplexer alternates between outputting said output of said first inverted amplifying portion and said reference voltage, and said second multiplexer alternates between outputting said output of said first inverted amplifying portion and said reference voltage by inverse selection of said first multiplexer.

12. A matched filter circuit as claimed in claim 1, wherein one of said first multiplexer and said second multiplexer outputs said output of said first inverted amplifying portion, or both first and second multiplexer output said reference voltage.

13. The matched filter circuit of claim 1, wherein said plurality of sample and holding circuits, said first addition portion and second addition portion define a group, said matched filter circuit further comprising a plurality of said groups, each group comprising said plurality of sample and holding circuits, and said first addition portion and said second addition portion, wherein said output of each said second addition portion is subtracted by said subtraction portion from said output of each said first addition portion.

14. The matched filter circuit of claim 1, wherein said plurality of sample and holding circuits, said first addition portion and second addition portion define a group, said matched filter circuit further comprising:
a plurality of said groups, each group comprising said plurality of sample and holding circuits, said first addition portion and second addition portion;
a fifth addition portion comprising:
a plurality of sixth capacitances each connected to an output of each of said first addition portions and each producing a sixth capacitance output;
a sixth inverted amplifying portion having an odd number of stages of MOS inverters, said sixth inverted amplifying portion being commonly connected to the sixth capacitance outputs, and producing a sixth inverted amplifying portion output;
a sixth feedback capacitance connecting the sixth inverted amplifying portion output to a sixth inverted amplifying portion input; and
a sixth addition portion comprising:
a plurality of seventh capacitances each connected to an output of each of said second addition portions, and said sixth inverted amplifying portion output and each producing a seventh capacitance output;
a seventh inverted amplifying portion having an odd number of stages of MOS inverters, said seventh inverted amplifying portion being commonly connected to each seventh capacitance output, and producing a seventh inverted amplifying portion output; and
a seventh feedback capacitance connecting the seventh inverted amplifying portion output to a seventh inverted amplifying portion input,
wherein said fifth addition portion and said sixth addition portion comprise said subtraction portion for subtracting the outputs from each second addition portion from the outputs of each first addition portion.

* * * * *